United States Patent
Fan

(10) Patent No.: US 8,610,483 B2
(45) Date of Patent: Dec. 17, 2013

(54) VOLTAGE-LIMITING CIRCUIT

(75) Inventor: Jiashuan Fan, Shenzhen (CN)

(73) Assignee: Shenzhen Clou Inverter Co., Ltd., Shenzhen (CN)

( * ) Notice: Subject to any disclaimer, the term of this patent is extended or adjusted under 35 U.S.C. 154(b) by 0 days.

(21) Appl. No.: 13/489,439

(22) Filed: Jun. 5, 2012

(65) Prior Publication Data

US 2012/0242391 A1  Sep. 27, 2012

Related U.S. Application Data

(63) Continuation-in-part of application No. PCT/CN2010/078206, filed on Oct. 28, 2010.

(30) Foreign Application Priority Data

Feb. 5, 2010 (CN) .......................... 2010 1 0110043

(51) Int. Cl.
*H03K 5/08* (2006.01)
(52) U.S. Cl.
USPC .......................................... 327/309; 327/321
(58) Field of Classification Search
USPC .......................................... 327/306, 309–330
See application file for complete search history.

(56) References Cited

U.S. PATENT DOCUMENTS 6,137,339 A * 10/2000 Kibar et al. .................... 327/333
6,617,906 B1 * 9/2003 Hastings ........................ 327/321

* cited by examiner

*Primary Examiner* — Dinh T. Le
(74) *Attorney, Agent, or Firm* — Matthias Scholl P.C.; Matthias Scholl

(57) ABSTRACT

A voltage-limiting circuit, including a series branch circuit having a plurality of power switching devices, a plurality of energy temporary-storage circuits, and a centralized voltage-limiting circuit for limiting voltage for the series branch circuit. Each power switching device includes a control terminal, a high-end, and a low-end, and is connected in parallel with one energy temporary-storage circuit. The energy temporary-storage circuits include clamping diodes, energy storage capacitors, static voltage-sharing resistors, and energy return ends. In each energy temporary-storage circuit, the energy storage capacitors are connected in parallel with the static voltage-sharing resistors to form the energy return ends, and then connected in series with the clamping diodes. The centralized voltage-limiting circuit includes a voltage-limiting functional circuit and a plurality of energy concentration diodes for concentrating the energy temporarily stored by the corresponding energy temporary-storage circuits.

12 Claims, 4 Drawing Sheets

VOLTAGE-LIMITING CIRCUIT

CROSS-REFERENCE TO RELATED APPLICATIONS

This application is a continuation-in-part of International Patent Application No. PCT/CN2010/078206 with an international filing date of Oct. 28, 2010, designating the United States, now pending, and further claims priority benefits to Chinese Patent Application No. 201010110043.7 filed Feb. 5, 2010. The contents of all of the aforementioned applications, including any intervening amendments thereto, are incorporated herein by reference.

CORRESPONDENCE ADDRESS

Inquiries from the public to applicants or assignees concerning this document should be directed to: MATTHIAS SCHOLL P.C., ATTN.: DR. MATTHIAS SCHOLL ESQ., 14781 MEMORIAL DRIVE, SUITE 1319, HOUSTON, Tex. 77079.

BACKGROUND OF THE INVENTION

1. Field of the Invention

The invention relates to a voltage-limiting circuit, and more particularly to a voltage-limiting circuit with energy recovery function for automatically limiting the amplitude of voltage at two ends of each power switching device in series connection.

2. Description of the Related Art

The electricity grid provides electric energy generally in the form of industrial-frequency (50 Hz or 60 Hz) AC energy for users, however, the electric energy practically used by users is different, such as in the form of DC (for example, electrolytic aluminum), high-frequency AC (for example, induction heating), and frequency voltage adjusted as required (for example, variable frequency driver for a motor). Thus a converter is required to convert electrical energy. Power switching devices is core components of the converter widely-used for realizing the conversion of electrical energy.

Due to the limitation of current level of the semiconductor industry, for example, the insulated gate bipolar transistor IGBT provided in batches at present has the withstand voltage limit value of 1700 V or 3300 V, and the high voltage such as 10 kV and 500 kV cannot be directly processed with a single power switching device. Furthermore, a low-voltage power switching device has lower cost, therefore, the low-voltage power switching devices are usually connected in series during the practical application to solve the problem of poor voltage resistance. The parameters of a power switching device and a control circuit thereof have discreteness including temperature sensitivity and time variance, and the length of time in the switching-on process and switching-off process of the power switching device may be inconsistent. Thus, in a series branch circuit for the power switching device, the power switching device with longer switching-on process and shorter switching-off process has to bear higher voltage, and the device with little leakage current has to bear higher voltage when being cut off. The higher voltage is detrimental to the work of the power switching device, and even the power switching device will suffer from breakdown damage when the voltage exceeds the withstand voltage limit value of the power switching device. Therefore, when the power switching devices are connected in series, special measures are required to be taken, and the voltage at two ends of the power switching device is limited in the safe range, for example, within the range of 70% of its withstand voltage limit value.

In the application of series connection of the power switching device, a currently used technical method is that a dynamic and static voltage-sharing absorption unit circuit is connected on each power switching device in parallel. As shown in FIG. 1, the dynamic and static voltage-sharing absorption unit circuit includes a diode, a capacitor, and a parallel voltage-stabilizing circuit, and can fulfill the voltage limiting function.

The prior technical method has the disadvantages that first, one power switching device corresponds to one parallel voltage-stabilizing circuit, more parallel voltage-stabilizing circuits are used, the number of elements is large, and the utilization ratio is low; second, each parallel voltage-stabilizing circuit is required to be debugged independently, and when the stabilized-voltage value is changed, all the parallel voltage-stabilizing circuits are required to be changed, thus the workload is heavy; third, the parallel voltage-stabilizing circuit adopts energy-consuming type design and needs to consume electric energy, thus the efficiency of the complete machine using the technology is reduced.

SUMMARY OF THE INVENTION

The technical problems required to be solved in the invention are as follows: overcoming the defects of large number of the used parallel voltage-stabilizing circuits, large number of elements and low utilization ratio in the prior art, and solving the technical problem of heavy workload because each parallel voltage-stabilizing circuit is required to be debugged independently, and when the stabilized-voltage value is changed, all the parallel voltage-stabilizing circuits are required to be changed. The invention also overcomes the technical problems in the prior art that the parallel voltage-stabilizing circuit adopts an energy-consuming type design and needs to consume electric energy, thus the efficiency of the complete machine using the technology is reduced.

To achieve the above objective, in accordance with one embodiment of the invention, there is provided a voltage-limiting circuit for power switching devices connected in series. The voltage-limiting circuit comprises a series branch circuit comprising a plurality of power switching devices. Each power switching device comprises a control terminal, a high-end, and a low-end, and in the series branch circuit, the series connection of the power switching devices is that a high-end of a power switching device is connected with a low-end of another power switching device in series. The voltage-limiting circuit further comprises a plurality of energy temporary-storage circuits, and each power switching device is connected in parallel with one energy temporary-storage circuit. The energy temporary-storage circuits comprise clamping diodes, energy storage capacitors, static voltage-sharing resistors, and energy return ends. In each energy temporary-storage circuit, the energy storage capacitors are connected in parallel with the static voltage-sharing resistors to form the energy return ends, and then connected in series with the clamping diodes. The voltage-limiting circuit further comprises a centralized voltage-limiting circuit for limiting voltage for the series branch circuit, the centralized voltage-limiting circuit comprises a voltage-limiting functional circuit and a plurality of energy concentration diodes for concentrating the energy temporarily stored by the corresponding energy temporary-storage circuits. The anodes and cathodes of the energy concentration diodes are in series connected in sequence. The anodes of the energy concentration diodes are connected with the energy return ends, respectively, and the cathode of the energy concentration diode is connected with the energy return end.

In a class of this embodiment, in the energy temporary-storage circuit, after the energy storage capacitor is connected with the static voltage-sharing resistor in parallel, one end of the energy storage capacitor is connected with the cathode of the clamping diode to form an energy return end, the other end of the energy storage capacitor is connected to the low-end of the power switching device connected with the energy temporary-storage circuit in parallel, and the anode of the clamping diode is connected to the high-end of the power switching device connected with the energy temporary-storage circuit in parallel.

In a class of this embodiment, in the energy temporary-storage circuit, after the energy storage capacitor is connected with the static voltage-sharing resistor in parallel, one end of the energy storage capacitor is connected with the anode of the clamping diode to form an energy return end, the other end of the energy storage capacitor is connected to the high-end of the power switching device connected with the energy temporary-storage circuit in parallel, and the cathode of the clamping diode is connected to the low-end of the power switching device connected with the energy temporary-storage circuit in parallel.

In a class of this embodiment, the centralized voltage-limiting circuit comprises a voltage-limiting functional circuit and a plurality of energy concentration diodes for concentrating the energy temporarily stored by the corresponding energy temporary-storage circuits. The anodes and cathodes of the energy concentration diodes are in series connected in sequence. The anodes of the energy concentration diodes are connected with the corresponding energy return ends, respectively, and the cathode of the energy concentration diode is connected with a first energy return end. The centralized voltage-limiting circuit further comprises an energy concentration diode, the high voltage end of the voltage-limiting functional circuit is connected with the cathode of the energy concentration diode, the low voltage end of the voltage-limiting functional circuit is connected with the high-end of a first power switching device, and the anode of the energy concentration diode is connected with the energy return end of a first energy temporary-storage circuit.

In a class of this embodiment, the centralized voltage-limiting circuit comprises a voltage-limiting functional circuit and a plurality of energy concentration diodes for concentrating the energy temporarily stored by the corresponding energy temporary-storage circuits. The anodes and cathodes of the energy concentration diodes are in series connected in sequence. The anodes of the energy concentration diodes are connected with the corresponding energy return ends, respectively, and the cathode of the energy concentration diode is connected with a first energy return end. The centralized voltage-limiting circuit further comprises an energy concentration diode, the low voltage end of the voltage-limiting functional circuit is connected with the anode of the energy concentration diode, the high voltage end of the voltage-limiting functional circuit is connected with the low-end of a last power switching device, and the cathode of the energy concentration diode is connected with the energy return end of a last energy temporary-storage circuit.

In a class of this embodiment, two ends of the energy concentration diodes except the energy concentration diode are connected with two adjacent energy return ends or connected at an interval of one or more energy return ends.

In a class of this embodiment, the voltage-limiting functional circuit returns the inflow energy to a power supply or provides the inflow energy for a load converter.

In a class of this embodiment, the voltage-limiting circuit for the power switching devices connected in series further comprises surge absorption circuits or surge absorption elements for absorbing the surge voltage of the power switching device. The surge absorption circuits or surge absorption elements are connected with the corresponding power switching devices in parallel.

In a class of this embodiment, the energy concentration diode is formed by connecting a diode and an inductor in series.

Advantages of the invention are summarized below: in the provided voltage-limiting circuit for the power switching devices connected in series, a centralized voltage-limiting circuit is used for finishing the regulation of the voltage limit value at one time; meanwhile, a plurality of energy temporary-storage circuits matched with the power switching devices are adopted, and return the inflow energy of the voltage-limiting circuit to a power supply or provide the inflow energy for a load for effective utilization, thus the overall efficiency is improved.

DETAILED DESCRIPTION OF THE EMBODIMENTS

For further illustrating the invention, experiments detailing a voltage-limiting circuit for power switching devices connected in series are described below.

Figure 1:
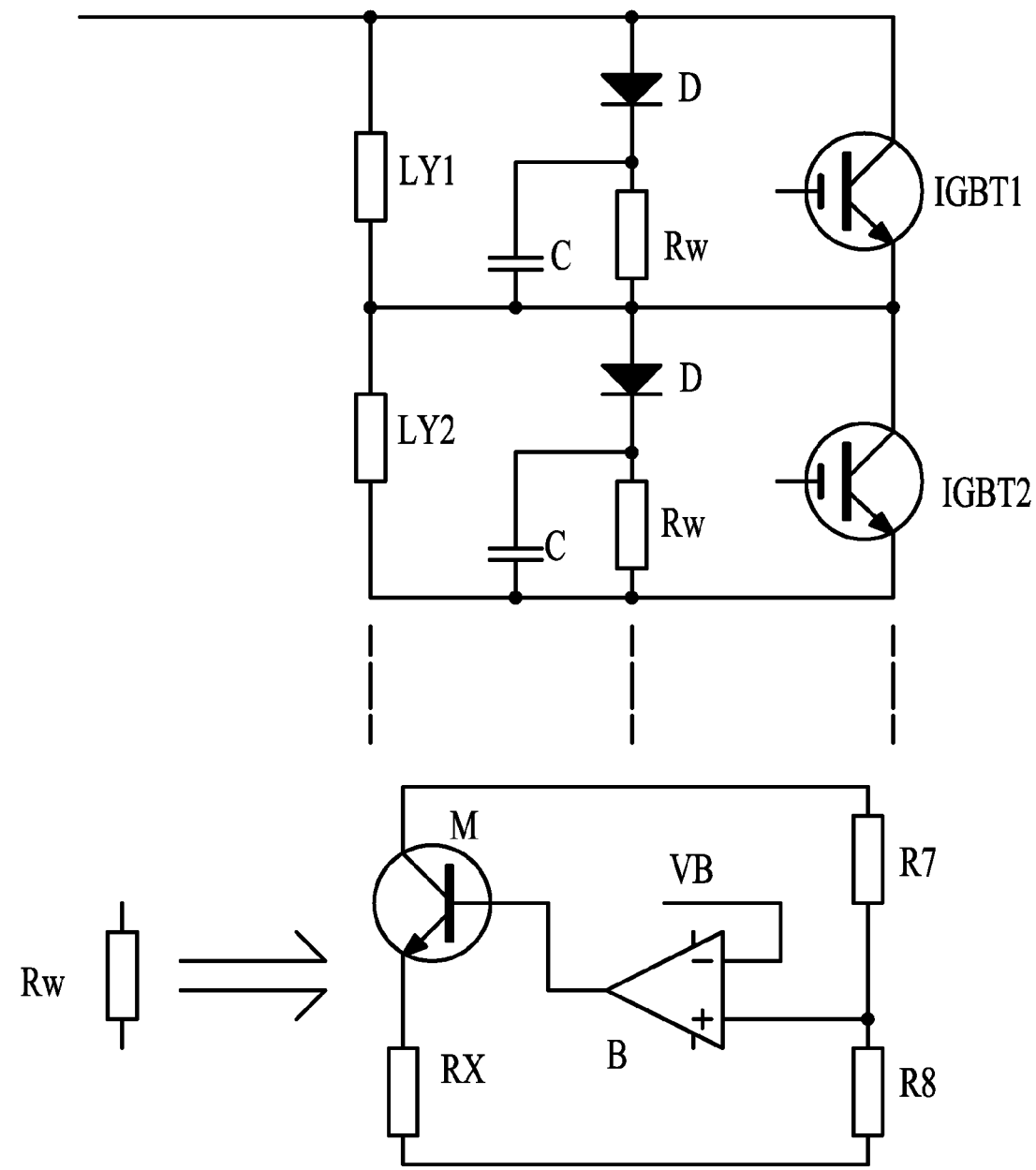
FIG. 1 is a circuit diagram of a series power switch arm in the prior art.
Figure 2:
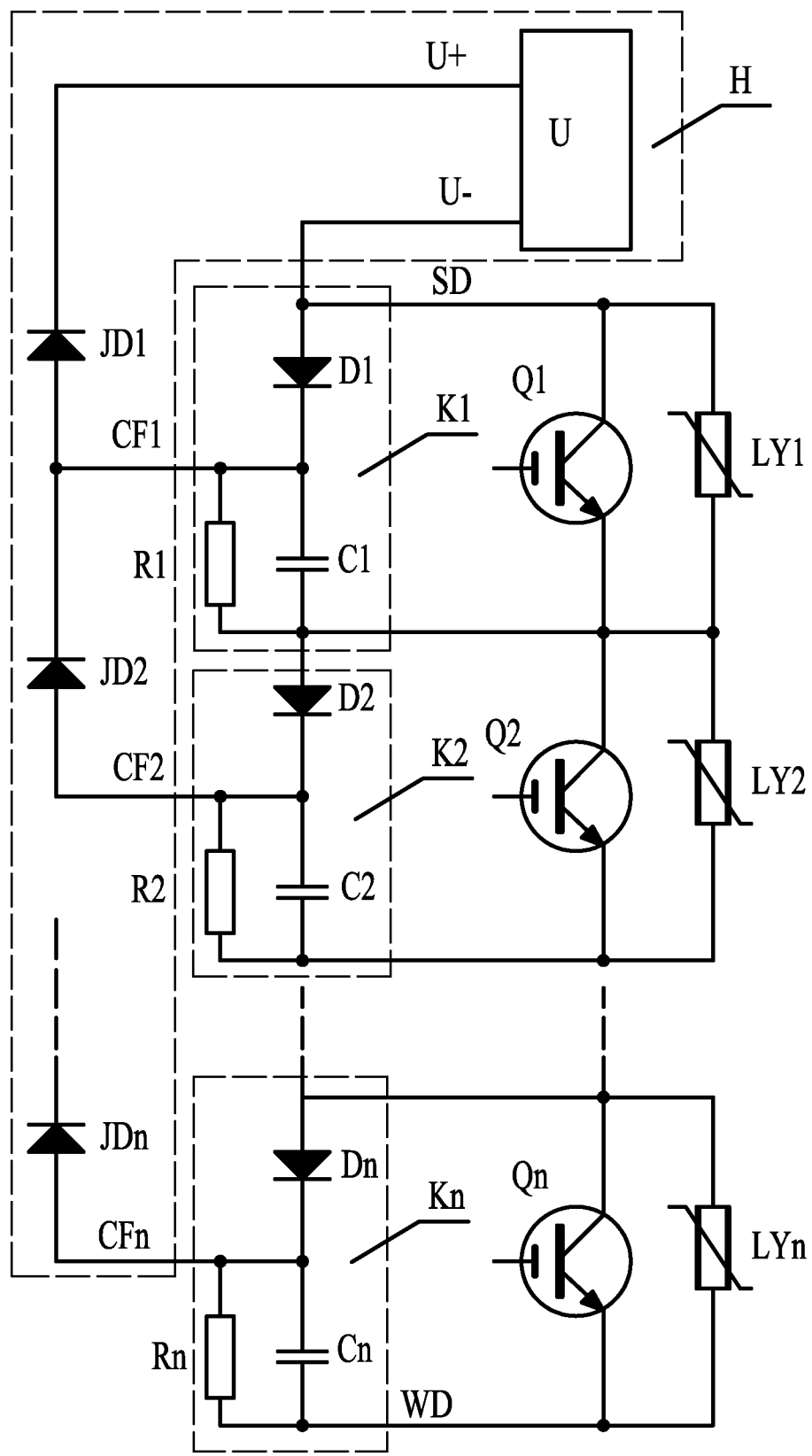
FIG. 2 is a circuit diagram of a voltage-limiting circuit for power switching devices connected in series in accordance with one embodiment of the invention.

As shown in FIG. 2, a voltage-limiting circuit for power switching devices connected in series comprises a series branch circuit comprising a plurality of power switching devices Q1-Qn. Each power switching device comprises a control terminal, a high-end SD, and a low-end WD. In the series branch circuit, the series connection of the power switching devices Q1-Qn is that the high-end SD of a power switching device is in series connected with the low-end WD of another power switching device in sequence, that is, the low-end of the power switching device Q1 is connected with the high-end of the power switching device Q2, the low-end of the power switching device Q2 is connected with the high-end of the power switching device Q3, and so forth, and the low-end of the power switching device Qn-1 is connected with the high-end of the power switching device Qn. The voltage-limiting circuit for the power switching devices connected in series further comprises a plurality of energy temporary-storage circuits K1-Kn. The energy temporary-storage circuit used for storing the fast flow energy of load current during the nonsynchronous switching on-off process of the power switching devices is correspondingly connected at two ends of each power switching device in parallel, and correspondingly, the energy temporary-storage circuits K1, K2 . .

. Kn are correspondingly connected at two ends of the power switching devices Q1, Q2 . . . Qn in parallel. The energy temporary-storage circuits K are in series connected in sequence, that is, the energy temporary-storage circuit K1 is connected with the energy temporary-storage circuit K2 in series, the energy temporary-storage circuit K2 is connected with the energy temporary-storage circuit K3 in series, and so forth, and the energy temporary-storage circuit Kn-1 is connected with the energy temporary-storage circuit Kn in series. The energy temporary-storage circuits K1-Kn comprise clamping diodes D1-Dn, energy storage capacitors C1-Cn, static voltage-sharing resistors R1-Rn, and energy return ends CF1-CFn. In each energy temporary-storage circuit, the energy storage capacitors are connected with the static voltage-sharing resistors in parallel to form the energy return ends, then the energy return ends are connected with the clamping diodes in series, and the energy temporary-storage circuit is connected with the power switching device in parallel. After the energy storage capacitor is connected with the static voltage-sharing resistor in parallel, one end of the energy storage capacitor is connected with the cathode of the clamping diode to form an energy return end, the other end of the energy storage capacitor is connected to the low-end WD of the power switching device, and the anode of the clamping diode is connected with the high-end SD of the power switching device. A centralized voltage-limiting circuit H for limiting voltage for the series branch circuit is also included in the voltage-limiting circuit. The centralized voltage-limiting circuit H comprises a voltage-limiting functional circuit U and a plurality of energy concentration diodes JD1-JDn for concentrating the energy temporarily stored by the corresponding energy temporary-storage circuits K. The anodes and cathodes of the energy concentration diodes JD1-JDn are in series connected in sequence, and the energy concentration diodes JD1-JDn are connected with the energy return ends CF1-CFn, respectively. The voltage-limiting circuit for the power switching devices connected in series adopts the energy temporary-storage circuits matched with the power switching devices, correspondingly, the energy temporary-storage circuits K1, K2 . . . Kn are correspondingly connected at two ends of the power switching devices Q1, Q2 . . . Qn in parallel. The energy of load current during the nonsynchronous switching on-off process of the power switching devices Q1, Q2 . . . Qn is temporarily stored through the energy temporary-storage circuits K1, K2 . . . Kn, and the temporarily stored energy is transmitted to the voltage-limiting functional circuit U step by step for processing during the stable conduction of the power switching devices Q1, Q2 . . . Qn. Only one centralized voltage-limiting circuit H is used in the voltage-limiting circuit for the power switching devices connected in series, fewer elements are used, and the regulation of the voltage limit value can be finished at one time, thus the operation is convenient.

As shown in FIG. 2, preferably, the centralized voltage-limiting circuit H comprises a voltage-limiting functional circuit U and a plurality of energy concentration diodes JD2-JDn for concentrating the energy temporarily stored by the corresponding energy temporary-storage circuits K. The anodes and cathodes of the energy concentration diodes JD2-JDn are in series connected in sequence, the anodes of the energy concentration diodes JD2-JDn are connected with the corresponding energy return ends CF2-CFn, respectively, and the cathode of the energy concentration diode JD2 is connected with the energy return end CF1. The centralized voltage-limiting circuit H further comprises an energy concentration diode JD1. The high voltage end U+ of the voltage-limiting functional circuit U is connected with the cathode of the energy concentration diode JD1, the low voltage end U− of the voltage-limiting functional circuit U is connected with the high-end SD of a first power switching device, and the anode of the energy concentration diode JD1 is connected with the energy return end CF1 of a first energy temporary-storage circuit K1.

Specifically, the energy temporary-storage circuit is correspondingly connected at two ends of each power switching device in parallel. All the energy temporary-storage circuits are consistent in form; the ith energy temporary-storage circuit Ki comprises a clamping diode Di, an energy storage capacitor Ci, and a static voltage-sharing resistor Ri. After the energy storage capacitor Ci is connected with the static voltage-sharing resistor Ri in parallel, one end of the energy storage capacitor Ci is connected with the cathode of the clamping diode Di to form an energy return end CFi, the other end of the energy storage capacitor Ci is connected to the low-end of the power switching device Qi, and the anode of the clamping diode Di is connected with the high-end of the power switching device Qi. Meanwhile, in the voltage-limiting circuit, the anode of the ith energy concentration diode JDi is connected with the energy return end CFi of the ith energy temporary-storage circuit, the cathode of the ith energy concentration diode JDi is connected with the energy return end CFi-1 of the (i-1)th energy temporary-storage circuit, and so forth. In an embodiment, the voltage-limiting functional circuit U is connected at two ends of the energy storage capacitor C in parallel, is a shunt voltage regulator, keeps the voltage at two ends basically unchanged when electric energy flows in, and is not provided with an energy concentration diode JD1.

In another embodiment, an energy concentration diode JD1 is provided. The high voltage end U+ of the voltage-limiting functional circuit U is connected with the cathode of the energy concentration diode JD1, the low voltage end U− of the voltage-limiting functional circuit U is connected with a head end SD of the series branch circuit, and the anode of the energy concentration diode JD1 is connected with the energy return end CF1 of a first energy temporary-storage circuit.

Figure 3:
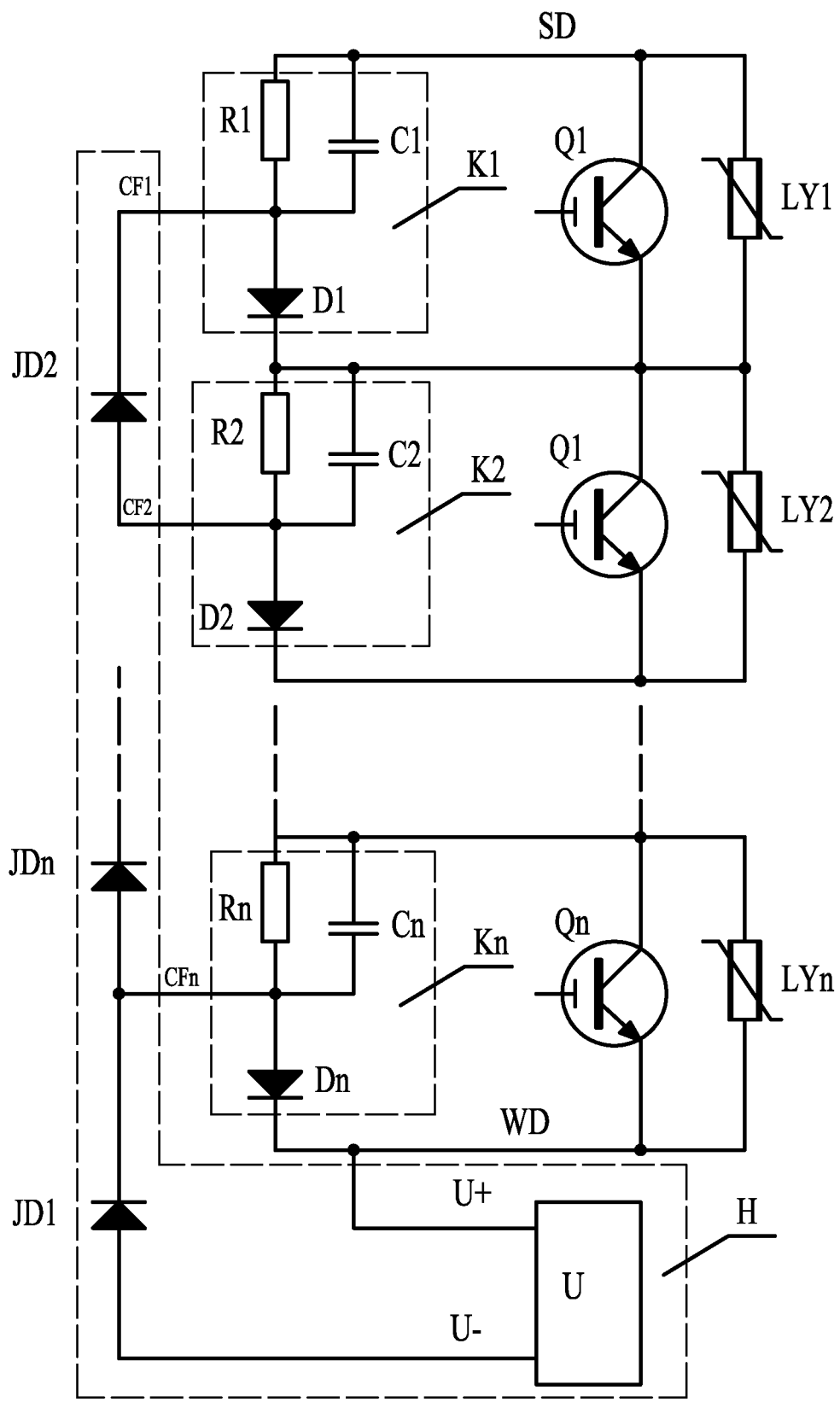
FIG. 3 is another circuit diagram of a voltage-limiting circuit for power switching devices connected in series in accordance with one embodiment of the invention.

As shown in FIG. 3, preferably, the energy temporary-storage circuits K1-Kn comprise clamping diodes D1-Dn, energy storage capacitors C1-Cn, static voltage-sharing resistors R1-Rn, and energy return ends CF1-CFn. In each energy temporary-storage circuit, after the energy storage capacitors are connected with the static voltage-sharing resistors in parallel to form the energy return ends, then the energy return ends are connected with the clamping diodes in series, and the energy temporary-storage circuit is connected with the power switching device in parallel. After the energy storage capacitor is connected with the static voltage-sharing resistor in parallel, one end of the energy storage capacitor is connected with the anode of the clamping diode to form an energy return end, the other end of the energy storage capacitor is connected to the high-end SD of the power switching device, and the cathode of the clamping diode is connected with the low-end WD of the power switching device. The centralized voltage-limiting circuit H comprises a voltage-limiting functional circuit U and a plurality of energy concentration diodes JD2-JDn for concentrating the energy temporarily stored by the corresponding energy temporary-storage circuits K. The anodes and cathodes of the energy concentration diodes JD2-JDn are in series connected in sequence, and the anodes of the energy concentration diodes JD2-JDn are connected with the corresponding energy return ends CF2-CFn, respectively; the centralized voltage-limiting circuit H further comprises an energy concentration diode JD1. The low voltage end U− of the voltage-limiting functional circuit U is connected with the anode of the energy concentration diode JD1, the high voltage end U+ of the voltage-limiting functional circuit U is connected with the low-end WD of a last power switching device, and the cathode of the energy concentration diode JD1 is connected with the energy return end CFn of a last energy temporary-storage circuit Kn.

Specifically, the energy temporary-storage circuit is correspondingly connected at two ends of each power switching device in parallel, all the energy temporary-storage circuits are consistent in form, and the ith energy temporary-storage circuit Ki comprises a clamping diode Di, an energy storage capacitor Ci and a static voltage-sharing resistor Ri. After the energy storage capacitor Ci is connected with the static voltage-sharing resistor Ri in parallel, one end of the energy storage capacitor Ci is connected with the anode of the clamping diode Di to form an energy return end CFi, the other end of the energy storage capacitor Ci is connected to the high-end of the power switching device Qi, and the cathode of the clamping diode Di is connected with the low-end of the power switching device Qi. Meanwhile, in the voltage-limiting circuit, the anode of the ith energy concentration diode JDi is connected with the energy return end CFi of the ith energy temporary-storage circuit, and the cathode of the ith energy concentration diode JDi is connected with the energy return end CFi-1 of the (i-1)th energy temporary-storage circuit, and so forth. In an embodiment, the voltage-limiting functional circuit U is connected at two ends of the energy storage capacitor Cn in parallel, is a shunt voltage regulator, keeps the voltage at two ends basically unchanged when electric energy flows in, and is not provided with an energy concentration diode JD1.

In another embodiment, an energy concentration diode JD1 is provided. The high voltage end U+ of the voltage-limiting functional circuit U is connected with a tail end WD of the series branch circuit, the low voltage end U− of the voltage-limiting functional circuit U is connected with the anode of the energy concentration diode JD1, and the cathode of the energy concentration diode JD1 is connected with the energy return end CFn of a last energy temporary-storage circuit.

In the specific implementation process, when a plurality of power switching devices connected in series are required to be synchronously switched on under control, a slowly switched-on power switching device Qi is also changed into an on-state after a short time delay of 1 microsecond after other power switching devices have been conducted. During the short-time delay period, the load current accumulates charge in the energy storage capacitor Ci through the energy temporary-storage circuit connected at two ends of the slowly switched-on power switching device Qi in parallel, thereby leading to slight voltage rise. For example, when the load current is 100 amps, the delay time is 1 microsecond, and the energy storage capacitor Ci is 10 µF, the voltage rises by 10 V, i.e., 100 amps*1 microsecond/10 µF.

When the power switching devices connected in series are required to be synchronously switched off under control, a rapidly switched-off power switching device Qx is switched off in advance before the switch-off of other power switching devices, and then other power switching devices are also changed into an off-state after a short time delay of 1 microsecond. During the short-time delay period, the load current accumulates charge in the energy storage capacitor Cx in the way that the energy temporary-storage circuit is connected at two ends of the rapidly switched-off power switching device Qx in parallel to form a closed circuit, thereby leading to slight voltage rise. For example, when the load current is 100 amps, the delay time is 1 microsecond, and the energy storage capacitor Cx is 10 µF, the voltage rises by 10 V, i.e., 100 amps*1 microsecond/10 µF.

Due to the discreteness of the power switching device and the control circuit thereof, a plurality of energy storage capacitors may rise in voltage, in the two energy storage capacitors with highest voltage rise, one energy storage capacitor corresponds to the switching-on process, the other energy storage capacitor corresponds to the switching-off process, the worst situation is that the same energy storage capacitor is in the maximum rise in the two processes, and in the above example, the maximum voltage rise is 20 V.

Figure 4:
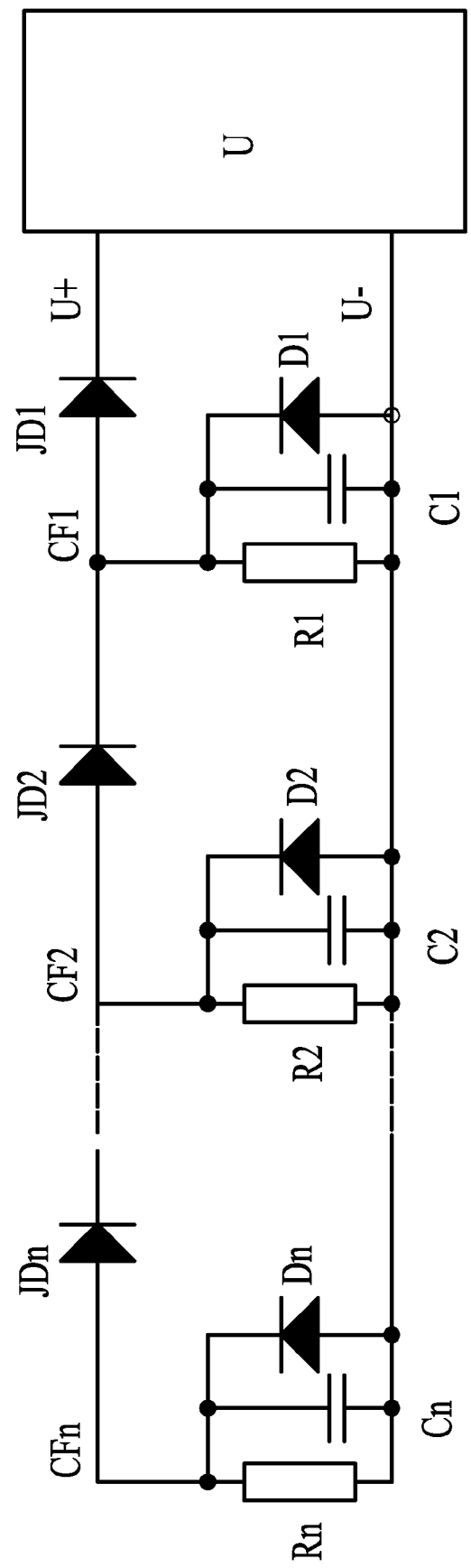
FIG. 4 is an equivalent circuit diagram of a power switching device in stable conduction in accordance with one embodiment of the invention.

During the synchronous stable conduction period of the power switching devices connected in series under control, its equivalent circuit is shown in FIG. 4, and at the moment, the on-state voltage drop of the power switching device is ignored. In the above process, the energy temporarily stored in the energy storage capacitor Ci and energy storage capacitor Cx flows towards the voltage-limiting functional circuit U step by step through the energy concentration diode, until the end voltage is equal to the stabilized voltage of the voltage-limiting functional circuit U, and the on-state voltage drop of the energy concentration diode is ignored at the moment.

After the energy concentration diode JD1 is additionally arranged, the head end SD (i.e., the high-end of the power switching device Q1) or tail end WD (i.e., the low-end of the power switching device Qn) of the series branch circuit is used as the reference point of the centralized voltage-limiting functional circuit U1, and at the moment, the conditions are created for a plurality of series branch circuits to share one voltage-limiting functional circuit U. Usually in a single-phase or multi-phase (three-phase) inverter, the head end SD of the series branch circuit is connected in parallel, and the tail end WD is also connected in parallel; in a voltage booster circuit and a push-pull circuit, the tail end WD of the series branch circuit is usually connected in parallel.

To ensure that the end voltage of the power switching devices connected in series does not exceed the limit value, a surge absorber is connected at two ends of each power switching device in parallel, the serial number is from LY1 to LYn, the further protection is provided for the voltage-limiting circuit during the failure, and the clamping voltage of the surge absorber is higher than the stabilized voltage of the voltage-limiting circuit, but lower than the withstand voltage of the power switching device.

The energy concentration diode JD is formed by connecting a diode and an inductor in series, and the conducting direction is not changed. The energy concentration diode is connected with an inductor in series, so as to limit the energy temporarily stored in the energy storage capacitor Ci, and when the series branch circuit is in the stable conduction state, the energy flows towards the current peak of the centralized voltage-limiting functional circuit U1 step by step through the energy concentration diode.

In the specific embodiment of the invention, two ends of other energy concentration diodes except for the energy concentration diode JD1 are connected with two adjacent energy return ends CF or connected at an interval of one or more energy return ends CF in accordance with specific conditions, and its requirement is that any energy return end CFi has a closed circuit for allowing the energy to quickly flow to the centralized voltage-limiting functional circuit U1 when the series branch circuit is in the stable conduction state. The voltage-limiting functional circuit U also can return the inflow energy to a power supply or provides the inflow energy for a load converter.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A voltage-limiting circuit, comprising:
   a) a series branch circuit comprising a plurality of power switching devices, the plurality of power switching devices comprising a first power switching device;
   b) a plurality of energy temporary-storage circuits, the plurality of energy temporary-storage circuits comprising a first energy temporary-storage circuit, the first energy temporary-storage circuit comprising a first energy return end; and
   c) a centralized voltage-limiting circuit for limiting voltage for the series branch circuit;
wherein:
   each of the plurality of power switching devices comprises a control terminal, a high-end, and a low-end;
   in the series branch circuit, the series connection of the plurality of power switching devices is that a high-end of a power switching device is connected with a low-end of another power switching device in series;
   each of the plurality of power switching devices is connected in parallel with one energy temporary-storage circuit;
   each of the plurality energy temporary-storage circuits comprises a clamping diode, an energy storage capacitor, a static voltage-sharing resistor, and an energy return end;
   in each of the plurality of energy temporary-storage circuits, the energy storage capacitor is connected in parallel with the static voltage-sharing resistor to form the energy return end, and then connected in series with the clamping diode;
   the centralized voltage-limiting circuit comprises a voltage-limiting functional circuit and a plurality of energy concentration diodes for concentrating the energy temporarily stored by the corresponding energy temporary-storage circuits, the plurality of energy concentration diodes comprising a first energy concentration diode and a second energy concentration diode;
   the voltage-limiting functional circuit returns inflow energy to a power supply or provides inflow energy for a load converter;
   anodes and cathodes of the plurality of energy concentration diodes except the first energy concentration diode are in series connected in sequence;
   anodes of the plurality of energy concentration diodes except the first energy concentration diode are connected with the corresponding energy return ends, respectively;
   a cathode of the second energy concentration diode is connected with the first energy return end;
   a high voltage end of the voltage-limiting functional circuit is connected with a cathode of the first energy concentration diode, and a low voltage end of the voltage-limiting functional circuit is connected with a high-end of the first power switching device; and
   an anode of the first energy concentration diode is connected with an energy return end of the first energy temporary-storage circuit.

2. The voltage-limiting circuit of claim 1, wherein in each of the plurality of energy temporary-storage circuits, after the energy storage capacitor is connected with the static voltage-sharing resistor in parallel, one end of the energy storage capacitor is connected with the cathode of the clamping diode to form the energy return end, and the other end of the energy storage capacitor is connected to the low-end of the power switching device connected with the energy temporary-storage circuit in parallel; and
   the anode of the clamping diode is connected to the high-end of the power switching device connected with the energy temporary-storage circuit in parallel.

3. The voltage-limiting circuit of claim 1, wherein
   in each of the plurality of energy temporary-storage circuits, after the energy storage capacitor is connected with the static voltage-sharing resistor in parallel, one end of the energy storage capacitor is connected with the anode of the clamping diode to form the energy return end, and the other end of the energy storage capacitor is connected to the high-end of the power switching device connected with the energy temporary-storage circuit in parallel; and
   the cathode of the clamping diode is connected to the low-end of the power switching device connected with the energy temporary-storage circuit in parallel.

4. The voltage-limiting circuit of claim 1, wherein two ends of each of the plurality of energy concentration diodes except the first energy concentration diode are connected with two adjacent energy return ends or connected at an interval of one or more energy return ends.

5. The voltage-limiting circuit of claim 1, wherein
   the voltage-limiting circuit further comprises surge absorption circuits or surge absorption elements for absorbing the surge voltage of the power switching device; and
   the surge absorption circuits or surge absorption elements are connected with the corresponding power switching devices in parallel.

6. The voltage-limiting circuit of claim 1, wherein each of the plurality of energy concentration diodes is formed by connecting a diode and an inductor in series.

7. A voltage-limiting circuit, comprising:
   a) a series branch circuit comprising a plurality of power switching devices, the plurality of power switching devices comprising a last power switching device;
   b) a plurality of energy temporary-storage circuits, the plurality of energy temporary-storage circuits comprising a last energy temporary-storage circuit, the last energy temporary-storage circuit comprising a last energy return end; and
   c) a centralized voltage-limiting circuit for limiting voltage for the series branch circuit;
wherein:
   each of the plurality of power switching devices comprises a control terminal, a high-end, and a low-end;
   in the series branch circuit, the series connection of the power switching devices is that a high-end of a power switching device is connected with a low-end of another power switching device in series;
   each of the plurality of power switching device is connected in parallel with one energy temporary-storage circuit;
   each of the plurality of energy temporary-storage circuits comprises a clamping diode, an energy storage capacitor, a static voltage-sharing resistor, and an energy return end;
   in each of the plurality of energy temporary-storage circuits, the energy storage capacitor is connected in parallel with the static voltage-sharing resistor to form the energy return end, and then connected in series with the clamping diode;

the centralized voltage-limiting circuit comprises a voltage-limiting functional circuit and a plurality of energy concentration diodes for concentrating the energy temporarily stored by the corresponding energy temporary-storage circuits, the plurality of energy concentration diodes comprising a first energy concentration diode and a second energy concentration diode;

the voltage-limiting functional circuit returns inflow energy to a power supply or provides inflow energy for a load converter;

anodes and cathodes of the plurality of energy concentration diodes except the first energy concentration diode are in series connected in sequence;

anodes of the plurality of energy concentration diodes except the first energy concentration diode are connected with the corresponding energy return ends, respectively;

a cathode of the second energy concentration diode is connected with the last energy return end;

a low voltage end of the voltage-limiting functional circuit is connected with an anode of the first energy concentration diode, and a high voltage end of the voltage-limiting functional circuit is connected with a low-end of the last power switching device; and a cathode of the first energy concentration diode is connected with an energy return end of the last energy temporary-storage circuit.

8. The voltage-limiting circuit of claim 7, wherein in each of the plurality of energy temporary-storage circuits, after the energy storage capacitor is connected with the static voltage-sharing resistor in parallel, one end of the energy storage capacitor is connected with the cathode of the clamping diode to form the energy return end, and the other end of the energy storage capacitor is connected to the low-end of the power switching device connected with the energy temporary-storage circuit in parallel; and the anode of the clamping diode is connected to the high-end of the power switching device connected with the energy temporary-storage circuit in parallel.

9. The voltage-limiting circuit of claim 7, wherein in each of the plurality of energy temporary-storage circuits, after the energy storage capacitor is connected with the static voltage-sharing resistor in parallel, one end of the energy storage capacitor is connected with the anode of the clamping diode to form the energy return end, and the other end of the energy storage capacitor is connected to the high-end of the power switching device connected with the energy temporary-storage circuit in parallel; and the cathode of the clamping diode is connected to the low-end of the power switching device connected with the energy temporary-storage circuit in parallel.

10. The voltage-limiting circuit of claim 7, wherein two ends of each of the plurality of energy concentration diodes except the first energy concentration diode are connected with two adjacent energy return ends or connected at an interval of one or more energy return ends.

11. The voltage-limiting circuit of claim 7, wherein the voltage-limiting circuit further comprises surge absorption circuits or surge absorption elements for absorbing the surge voltage of the power switching device; and the surge absorption circuits or surge absorption elements are connected with the corresponding power switching devices in parallel.

12. The voltage-limiting circuit of claim 7, wherein each of the plurality of energy concentration diodes is formed by connecting a diode and an inductor in series.

* * * * *